US006955986B2

(12) United States Patent
Li

(10) Patent No.: US 6,955,986 B2
(45) Date of Patent: Oct. 18, 2005

(54) ATOMIC LAYER DEPOSITION METHODS FOR FORMING A MULTI-LAYER ADHESION-BARRIER LAYER FOR INTEGRATED CIRCUITS

(75) Inventor: Wei-Min Li, Espoo (FI)

(73) Assignee: ASM International N.V. (NL)

( * ) Notice: Subject to any disclaimer, the term of this patent is extended or adjusted under 35 U.S.C. 154(b) by 0 days.

(21) Appl. No.: 10/403,846

(22) Filed: Mar. 27, 2003

(65) Prior Publication Data

US 2004/0192021 A1 Sep. 30, 2004

(51) Int. Cl.[7] .................... H01L 21/443; H01L 23/532
(52) U.S. Cl. .................... 438/687; 438/643; 438/644; 438/648; 438/653; 438/654; 438/656; 438/680; 257/751; 257/753; 257/761; 257/762; 257/764
(58) Field of Search ................. 257/751, 753, 257/761–764, 767; 438/627–628, 643–644, 648, 653–654, 656, 680, 685, 687

(56) References Cited

U.S. PATENT DOCUMENTS

| 4,058,430 A | 11/1977 | Suntola et al. |
| 4,486,487 A | 12/1984 | Skarp |
| 4,747,367 A | 5/1988 | Posa |

(Continued)

FOREIGN PATENT DOCUMENTS

| EP | 1063687 A2 * | 12/2000 | ......... H01L/21/285 |
| GB | 2372042 A | 8/2002 | |
| GB | 2372043 A | 8/2002 | |
| GB | 2372044 A | 8/2002 | |
| JP | 2000058777 | 2/2000 | |
| WO | WO 00/54320 | 9/2000 | |
| WO | WO 00/61833 | 10/2000 | |
| WO | WO 01/17692 A1 | 3/2001 | |
| WO | WO 01/66832 A2 | 9/2001 | |
| WO | WO 200199166 A1 * | 12/2001 | ......... C23C/16/06 |

OTHER PUBLICATIONS

Abeles, et al., *Amorphous Semiconductor Superlattices*, Physical Review Letters, Vo. 51, No. 21, Nov. 21, 1983, pp. 2003–2008.

Bai, "High K Gate Stack for Sub–0.1 UM CMOS Technology,"*Electrochemical Society Proceedings*, vol. 99–100, pp. 39–44 (1999).

Del Prado, et al., "Full composition range silicon oxynitride films deposited by ECR–PECVD at room temperature," *Thin Solid Films*, vol. 344, pp. 437–440 (1999).

Desu, et al, *Enhanced Dielectric Properties of Modified $Ta_2O_5$ Thin Films*, Mat Res. Innovat (1999) 2:299–302.

Hiltunen, et al., *Nitrades of Titanium, Niobium, Tantalum and Molybdenum Grown as Thin Films by the Atomic Layer Epitaxy Method*, Thin Solid Films, 168 (1988) pp. 149–154.

Ihanus, et al, *ALE Growth of $ZnS_{1-x}Se_x$ Thin Films by Substrating Surface Sulfur with Elemental Selenium*, Applied Surface Science 112 (1997) 154–158.

Kaizuka, et al., *Conformal Chemical Vapor Deposition TiN (111) Film Formation as an Underlayer of Al for Highly Reliable Interconnects*, jpn. J. Appl. Phys. vol. 33 (1994) pp. 470–474.

(Continued)

*Primary Examiner*—Stephen W. Smoot
(74) *Attorney, Agent, or Firm*—Knobbe, Martens, Olson & Bear LLP

(57) ABSTRACT

A process produces a layer of material which functions as a copper barrier layer, adhesion layer and a copper seed layer in a device of an integrated circuit, particularly in damascene or dual damascene structures. The method includes a step of depositing a diffusion barrier layer over a dielectric, a step of depositing a layer of graded metal alloy of two or more metals, and a step of depositing a copper seed layer, which step is essentially a part of the step of depositing the alloy layer.

24 Claims, 2 Drawing Sheets

U.S. PATENT DOCUMENTS

| | | | |
|---|---|---|---|
| 4,761,269 | A | 8/1988 | Conger et al. |
| 5,071,670 | A | 12/1991 | Kelly |
| 5,294,286 | A | 3/1994 | Nishizawa et al. |
| 5,306,666 | A | 4/1994 | Izumi |
| 5,449,314 | A | 9/1995 | Meikle et al. |
| 5,769,950 | A | 6/1998 | Takasu et al. |
| 5,795,495 | A | 8/1998 | Meikle |
| 5,916,365 | A | 6/1999 | Sherman |
| 6,174,799 | B1 | 1/2001 | Lopatin et al. |
| 6,174,809 | B1 | 1/2001 | Kang et al. |
| 6,200,893 | B1 * | 3/2001 | Sneh ............... 438/685 |
| 6,294,836 | B1 | 9/2001 | Paranjpe et al. |
| 6,329,704 | B1 | 12/2001 | Akatsu et al. |
| 6,362,526 | B1 | 3/2002 | Pramanick et al. |
| 6,365,502 | B1 | 4/2002 | Paranjpe et al. |
| 6,368,954 | B1 | 4/2002 | Lopatin et al. |
| 6,368,961 | B1 | 4/2002 | Lopatin et al. |
| 6,399,522 | B1 | 6/2002 | Tsan et al. |
| 6,607,976 | B2 * | 8/2003 | Chen et al. ............. 438/627 |
| 6,693,356 | B2 * | 2/2004 | Jiang et al. ............. 257/767 |
| 2001/0041250 | A1 * | 11/2001 | Werkhoven et al. ........ 428/212 |
| 2002/0006468 | A1 | 1/2002 | Paranjpe et al. |
| 2002/0102838 | A1 | 8/2002 | Paranjpe et al. |
| 2003/0201537 | A1 * | 10/2003 | Lane et al. ............. 257/751 |

OTHER PUBLICATIONS

Kikkawa, et al., *A Quarter–Micrometer Interconnection Technology Using a TiN/Al–Si–Cu/TiN/Al–Si–Cu/TiN/Ti Multilayer Structure*, IEEE Transactions on Electron Devices, vol. 40, No. 2, Feb. 1993, pp. 296–302.

Kikkawa, et al., *Al–Si–Cu/TiN Multilayer Interconnection and Al–Ge Reflow Sputtering Technologies for Quarter–Micron Devices*, SPIE vol. 1805 Submicrometer Metallization (1992), pp. 54–64.

Kim, et al., *The Effects of Substrate and Annealing Ambient on the Electrical Properties of $Ta_2O_5$ Thin Films Prepared By Plasma Enhanced Chemical Vapor Deposition*, Thin Film Solids 253 (1994) pp. 435–439.

Kukli, et al., *Atomic Layer Epitxy Growth of Tantalum Oxide Thin Films from $Ta(OC2H_5)$ and $H_2O$*, J. Electrochem. Soc. vol. 142, No. 5, May 1995 pp. 1670–1674.

Leskelä, et al., *Atomic Layer Epitaxy in Deposition of Various Oxide and Nitride Thin Films*, Journal De Physique IV, Colloque C5, Supplement au Journal de Physique II, vol. 5, Jun. 1995, pp. C5–937—C5–951.

Lucovsky, "Integration of Alternative High–K Gate Dielectrics into Aggressively Scaled CMOS Si Devices: Chemical Bonding Constraints at Si–Dielectric Interfaces," Electrochemical Society Proceedings, vol. 99–10, pp. 69–80 (1999).

Malti, et al.; "Improved ultrathin oxynitride formed by thermal nitridation and low pressure chemical vapor deposition process," *Applied Physics Letter*, vol. 61, No. 15, pp. 1790–1792 (1992).

Martensson, et al., *Use of Atomic Layer Epitaxy for Fabrication of Si/TiN/Cu Structures*, J. Vac Sci. Technol.B 17(5), Sep./Oct. 1999, pp. 2122–2128.

Min, et al., *Atomic Layer Deposition of TiN Films by Alternate Supply of Tetrakis (ethylmethylamino)–Titatium and Ammonia, Jpn. J. Appl. Phys.* vol. 37 (1998) pp. 4999–5004.

Min, et al., *Atomic Layer Deposition of TiN Thin Films by Sequential Introduction of Ti precursor and $NH_3$*. Mat. Res. Soc. Symp. Proc. vol. 514 1998, pp. 337–342.

Nakajima, et al., "Atomic–layer–deposited silicon–nitride/ $SiO_2$ stacked gate dielectrics for highly reliable ⇒–metal-1–oxide–semiconductor filed–effect transistors," Applied Physics Letters, vol. 77, No. 18, pp. 2855–2857 (2000).

Nakajima, et al., "Low–temperature formation of silicon nitride gate dielectrics by atomic–layer deposition," *Applied Physics Letters*, vol. 79, No. 5, pp. 665–667 (2001).

Niinistö, et al., *Synthesis of Oxide Thin Films and Overlayers by Atomic Layer Epitaxy for Advanced Applications*, Materials Science and Engineering B41 (1996) 23–29.

Ritala, et al., *Atomic Layer Epitaxy Growth of tiN Thin Films from $TiI_4$ and $NH_3$*, J. Electrochemical Soc., vol. 145, No. 8, Aug. 1998 pp. 2914–2920.

Ritala, et al., "Controlled Growth of TaN, $Ta_3N_5$, and $TaO_xN_y$ Thin Films by Atomic Layer Deposition," *Chem. Mater.*, vol. 11, pp. 1712–1718 (1999).

Ritala, et al, *Perfectly Conformal TiN and $Al_2O_3$Films Deposited by Atomic Layer Deposition*, Communications, Chemical Vapor Deposition 1999, 5, No. 1, pp. 7–9.

Ritala, et al., *Zirconium Dioxide Thin Films Deposited by ALE Using Zirconium Tetrachloride as Precursor*, Applied Surface Science, 75 (1994( pp. 333–340.

Sakaue, et al., *Digital Chemical Vapor Deposition of $SiO_2$Using a Repetitive Reaction of Triethylsilane/Hydrogen and Oxidation*, Japanese Journal of Applied Physics, vol. 30, No. 18, Jan. 1990, pp. L124–L127.

Singer, *Atomic Layer Deposition Targets Thin Films*, Semiconductor International, Sep. 1, 1999, 1 page.

Sneh, et al., *Atomic Layer Growth of $SiO_2$ on Si(100) Using $SiCl_4$ and $H_2O$ in a Binary Reaction Sequence*, Surface Science 334 (1995) 135–152.

Tiitta, et al., *Preparation and Characterization of Phosphorus–Doped Aluminum Oxide Thin Films*, Materials Research Bulletin, vol. 33, No. 9 pp. 1315–1323 1998.

Vehkarnäki, et al., *Growth of $SrTiO_3$ and $BaTiO_3$Thin Films by Atomic Layer Deposition*, Electronic and Solid State Letters, 2 (10) (1999) pp. 504–506.

Michael L. Wise, et al, *Diethyldiethoxysilane as a New Precursor for $SiO_2$Growth of Silicon*, Mat. Res. Soc. Symp. Proc. vol. 334, (1994), pp/ 37–43.

* cited by examiner

ATOMIC LAYER DEPOSITION METHODS FOR FORMING A MULTI-LAYER ADHESION-BARRIER LAYER FOR INTEGRATED CIRCUITS

FIELD OF THE INVENTION

The present invention relates generally to materials and process technology in semiconductor device manufacturing. In particular, the invention relates to forming layers in integrated circuits and more particularly to depositing thin liner layers in integrated circuits.

BACKGROUND OF THE INVENTION

In the manufacturing of integrated circuits (IC's), the individual devices, such as the transistors fabricated on the silicon substrate, must be connected together with electrical conductors, to perform the desired circuit functions. The process of forming interconnects is generally called metallization.

Metallization consists of many steps that are repeated for each metallization layer. One manner of simplifying the process of metallization is to employ damascene techniques. Instead of, depositing blanket layers and etching away excess metal to provide wiring patterns, damascene processing involves providing templates for wiring and by forming trenches in an insulating layer. Metal overfills the trenches and a polishing step removes the excess metal outside the trenches. Metal is thus left in a desired wiring pattern within the trenches. Where contact holes or vias extending from the floor of the trenches to lower conductive elements are simultaneously filled with metal, the method is known as a dual damascene process.

In damascene structures, the metallization layer is commonly realized by applying copper in order to reduce RC delay. One drawback of using copper interconnects is the rapid diffusion of copper through various dielectric materials that alters the dielectric properties of the device. Therefore, to prevent the diffusion of the copper, one or more liners are formed to provide a diffusion barrier for copper within the trenches and vias prior to metal fill. Low electrical resistivity is desired for the barrier layer in order to reduce the resistance of current flow in Cu interconnects.

Typically, copper is deposited by electrochemical deposition (ECD), which entails a prior conformal and conductive seed layer with low resistivity to cover the area to be coated with copper. A thin Cu film is usually deposited by physical vapor deposition (PVD) as a seed layer prior to ECD processing of copper. Also, a good wetting property of Cu on the barrier layer avoids Cu agglomeration and discontinuity of the seed layer on the barrier, which may affect the subsequent ECD process.

In the subsequent step, the overfilled liner and Cu are removed by chemical mechanical polishing (CMP). It is desirable that the adhesion of Cu to the liner and the adhesion of the Cu/liner film stack to the underlying and surrounding regions is good enough to prevent peeling of the layers and to ensure that the film stack can endure the stress caused by CMP. However, it is particularly difficult to provide a copper layer with good adhesion to the underlying diffusion barrier layer. One approach is to add an adhesion layer between the barrier and Cu seed layers. Good electrical contact between the different layers is also desirable for adequate functioning of the device.

Materials that are suitable to prevent the diffusion of copper include: refractory metals such as Ta, Ti, W, Mo, Co, Cr, Pd, and Nb; metal alloys such as Ta/Ir and Mo/Ni; metal nitride and carbide and boride such as TaNx, TiN, $W_2N$, HfN, TaC, TiC, $WC_x$ and $TiB_2$; ternary compounds such as $TiN:Si_x$, $TaN_x:Si_y$, $MoN:Si_x$, and $WN_xC_y$ and TaCN; and a nanolaminate or a sandwich of materials, such as Ta/Ti, $Ta/TaN_x$, TiN/Ti, TiN/Al, WN/WC, and WN/TiN etc. A diffusion barrier layer is often first deposited over the dielectrics of vias to ensure good electrical contact and good adhesion of the subsequently deposited layers to the underlying regions.

To improve the adhesion of copper to the diffusion barrier layer, an intermediate layer with good adhesion and barrier properties may be deposited prior to any Cu metallization. The adhesion layer may include, for example, metals, metal nitrides and/or alloys. A known adhesion layer is a layer that includes cobalt, cobalt-based alloys, ruthenium, or ruthenium-based alloys, platinum, or platinum based alloys.

The state-of-the-art copper seed layer material is a copper layer deposited by physical vapor deposition (PVD). The following alloys are also known as seed layers: copper-magnesium alloy, copper-tin alloy, copper-aluminum alloy and their nitrogen graded forms. Nitrogen in the copper alloy provides enhanced adhesion of the seed layer to a nitrogen containing barrier layer.

The metallization process may consist of depositing a barrier-adhesion-layer, depositing a copper seed layer, depositing a copper layer by ECD or by chemical vapor deposition (CVD), and planarization by CMP. A feature that enables the fabrication of integrated circuits and ensures high yield and productivity is a good adhesion and wetting of the copper layer to the barrier layer such that it can promote ECD copper deposition and survive the CMP process and other subsequent process steps, including thermal processing at temperature of 400° C. The properties of the copper-barrier interface are also important, since the interface strongly affects the electromagnetic properties of the metallization layer.

The above-described liners occupy a considerable volume of the trenches and that reduces the room available for the more conductive metal filler. Therefore, the conductivity is reduced in relation to the same trenches filled with metal only. Employing metal nitride liners tends to induce electromigration during circuit operation, possibly leading to voids and complete separation of metal lines and further resulting in reduced conductivity of the metal lines and device breakdown.

SUMMARY OF THE INVENTION

The preferred embodiments employ a multi layer structure of thin films having good performance as a copper diffusion barrier, as an adhesion layer and as a copper seed layer can be produced by atomic layer deposition (ALD), plasma enhanced atomic layer deposition (PEALD), or other modifications of ALD.

ALD is a current method of growing thin films. The general principles of ALD are disclosed, e.g., in U.S. Pat. Nos. 4,058,430 and 5,711,811, the disclosures of which are incorporated herein by reference. According to the method, a thin film is grown by means of saturated surface reactions, which are separated from each other. Previously, ALD has been known as atomic layer epitaxy (ALE). Reactors suitable for ALD processes are supplied, for example, by ASM® under the trade name of ALCVD™.

PEALD is a modification of an ALD method where the reactivity of one or more precursors is excited by the aid of plasma. Also, any modification of an ALD process is applicable, such as radical assisted ALD.

In context of the present invention, "an ALD type process" generally refers to a process for producing thin films over a substrate, in which process a solid thin film is formed molecular layer by molecular layer due to self-saturating chemical reactions on heated surfaces. In the process, gaseous reactants, i.e., precursors, are conducted into a reaction chamber of an ALD-type reactor and contacted with a substrate located in the chamber to provide a surface reaction. The pressure and the temperature of the reaction chamber are adjusted to a range where physisorption (i.e. condensation of gases) and thermal decomposition of the precursors are avoided. Consequently, only up to one monolayer (i.e. an atomic layer or a molecular layer) of material is deposited at a time during each pulsing cycle. The actual growth rate of the thin film, which is typically presented as Å/pulsing cycle, depends, for example, on the number of available reactive surface sites on the surface and the bulkiness of the chemisorbing molecules. Gas phase reactions between precursors and any undesired reactions of by-products are inhibited because precursor pulses are separated from each other by time and surplus gaseous reactants and reaction byproducts are removed from the reaction chamber with the aid of inert gas between material pulses.

In context of the present invention, "an ALD type reactor" means a reactor where the reaction space is in communication with an inactive gas source and at least two precursor sources that can be pulsed. The reaction space is also preferably in communication with a vacuum generator (e.g. a vacuum pump), and the temperature and pressure of the reaction space and the flow rates of gases can be adjusted to a range that makes it possible to grow thin films by ALD type processes.

According to one embodiment, the method of producing a multilayer structure comprises: depositing a diffusion barrier layer by ALD or by a modified process of ALD; and depositing a graded alloy layer over the diffusion barrier layer, the graded alloy layer comprising two metals, most preferably the metal used in the diffusion barrier layer and copper. The diffusion barrier layer and the alloy layer can be deposited in one reactor or in a platform that has one process module for depositing the diffusion barrier layer and another process module for depositing the alloy layer. The content of copper in the alloy layer increases from the bottom to the top of the layer in the thickwise direction. The copper content close to the bottom of the alloy layer (i.e. for instance within a distance of at least 3 Å from the bottom) approaches zero and close to the top of the layer (i.e. for instance within a distance of at least 3 Å from the top) the copper content is highest.

The novel thin film structure disclosed herein is a multilayer structure of two or more thin films. In one embodiment the multilayer structure comprises a diffusion barrier layer and graded metal alloy layer. The adhesion of one layer to another is increased due to modified interfaces of the thin films. The interfaces between the films are blurred by providing a graded composition of metals for at least one thin film. Possible agglomeration of Cu on a separate barrier layer is avoided. As only one reactor is needed, the cost of tools is also reduced. Due to the integrated nature of the thin film structure, the number of interface defects is reduced and therefore the electrical performance on an IC is improved.

In one embodiment the process includes an option to deposit the copper layer after the seed layer by an ALD type process, preferably in one reactor. This further simplifies the process of making damascene and dual damascene structures.

The methods and structures disclosed herein have a number of advantages over the prior art. For example, the thickness and, therefore, the volume occupied by the thin film structure are low resulting in increased relative volume of the copper conductor and decreased resistance of the conductor lines. Abrupt interfaces between different thin films are avoided, resulting in improved adhesion and complete wetting between thin films. Also, since the process for making the thin film structure and the structure itself is simple, manufacturing costs are reduced.

DETAILED DESCRIPTION OF THE PREFERRED EMBODIMENTS

Figure 1:
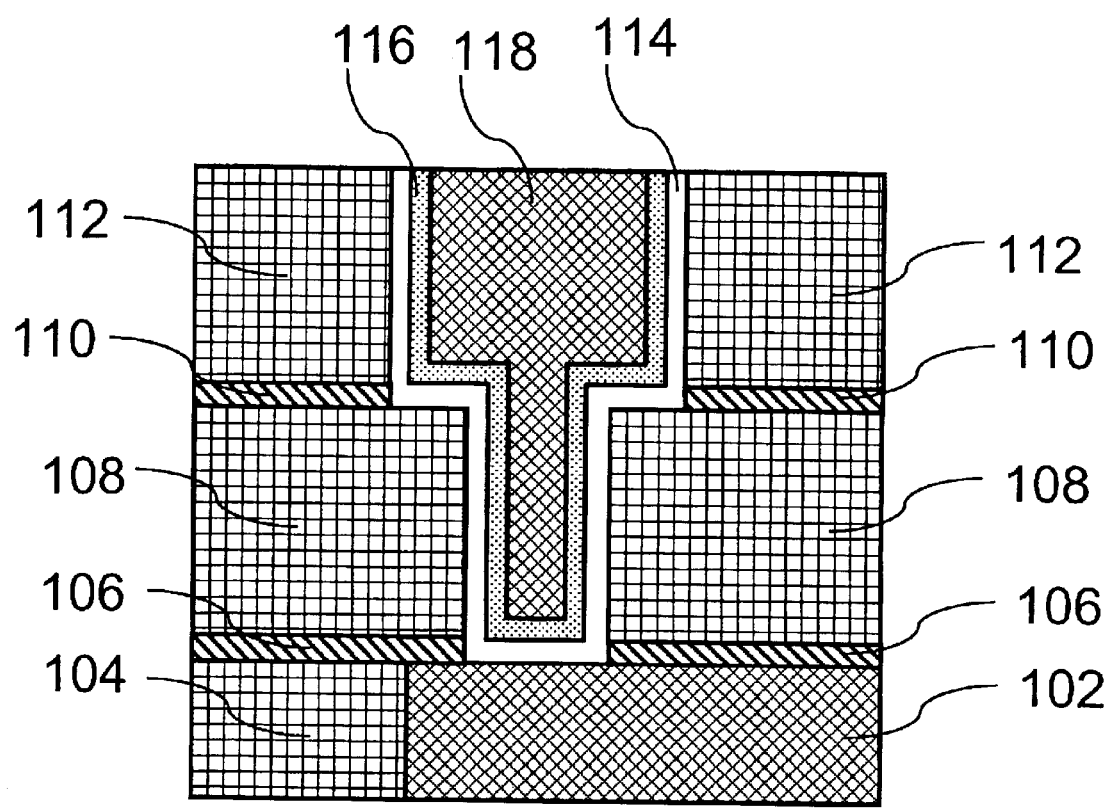
FIG. 1 is a schematic view of the dual damascene structure, where the multilayer structure of thin films of the preferred embodiments is utilized.

The dual damascene structure shown in FIG. 1 consists of a previous metallization layer 102, which may be made of copper metal, an insulating layer 104, which may be a form of $SiO_2$, a via etch stop layer 106 made of, e.g., $Si_3N_4$, a via level insulator 108, e.g., $SiO_2$, a trench etch stop 110 made of, e.g., $Si_3N_4$, a trench level insulator 112 made of, e.g., $SiO_2$, a diffusion barrier layer 114 deposited according to the preferred embodiments of the present invention, and an adhesion layer including a copper seed 116 and copper metal bulk fill 118. Layers 114 and 116 are integrated together to form a single layer without a sharp interface between layers 114 and 116, although an interface is shown in the drawing.

Figure 2:
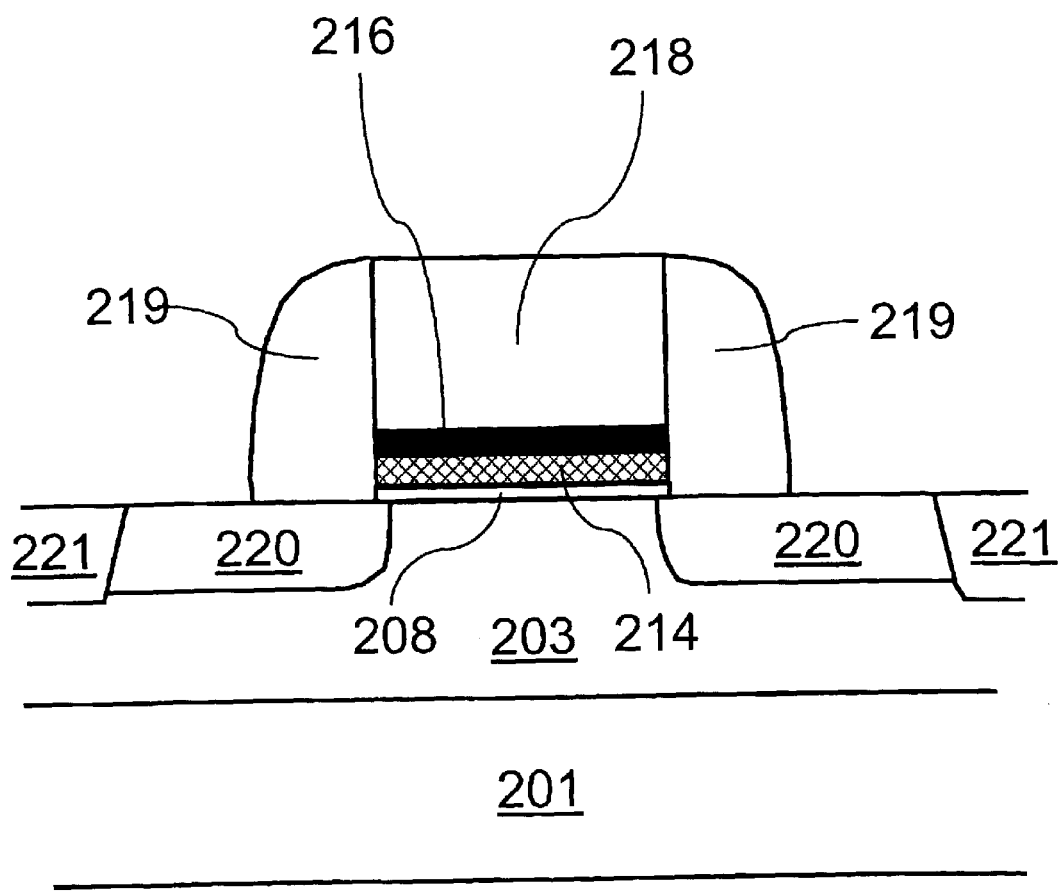
FIG. 2 is a schematic view of an NMOS transistor utilizing the multilayer structure deposited according to the method of the preferred embodiments.

A partial transistor structure, where the barrier/adhesion/copper seed layer of the preferred embodiments is used, is shown in FIG. 2. The device consists of a substrate 201, an n-type well 203, a p-type diffusion region 220 (right drain, left source), a shallow trench isolation oxide 221, a gate dielectric 208, a copper diffusion barrier layer 214, which contains an adhesion/seed layer 216, a gate metal 218, and gate isolation spacers 219.

Layers 114 and 214 contain refractory metal and serve as diffusion barriers, such as metal nitride or metal carbide or metal nitride and metal carbide. Layers 116 and 216 preferably contain an alloy of another metal and the refractory metal of layer 114 or 214 respectively.

The disclosed method will be described in detail by way of preferred embodiments with reference to accompanying drawings.

According to one aspect of the present invention, a layer that simultaneously functions as a barrier layer, an adhesion layer, and a seed layer (a barrier/adhesion/copper seed layer) is formed by depositing materials on integrated circuits by ALD or by any modified process of ALD, such as PEALD or radical assisted ALD or by a combined process of ALD and a modified ALD, such PEALD or radical assisted ALD.

According to the preferred embodiments, the process for producing a layer of material 114/116, 214/216 comprises a step of depositing a diffusion barrier layer 114, 214 over a dielectric of the IC 108, 112, 208, a step of depositing a layer of graded metal alloy of two or more metals 116, 216, and a step of depositing a copper seed layer, which step is essentially a part of the step of depositing the alloy layer. In context of the present application, a metal alloy means a solid mixture of two or more metals. The alloy is formed essentially of metals and therefore, nonmetallic elements may be present as impurities only.

In the first step of the process, the diffusion barrier layer 114, 214 is deposited by PEALD or by ALD over a dielectric layer of an integrated circuit. The diffusion barrier layer 114, 214 is made of refractory metal and preferably contains a nitride of the refractory metal or a metal carbide. Suitable refractory metals are for example Ta, Ti, Zr, Hf, W, Mo, Co, Cr, Pd, and Nb. Suitable metal nitrides include, for example, tantalum nitride, titanium nitride, tungsten nitride, and hafnium nitride. The refractory metal is more preferably tungsten (W), tantalum (Ta) or titanium (Ti). The diffusion barrier layer may be, for example, a thin film that contains W, WN and WC (W/WN$_x$C$_y$), or a nanolaminate, such as a sandwich of Ta and TaN (Ta/TaN), or Ti and TiN (Ti/TiN). The thickness of the barrier layer is preferably between about 0.3 nm–5 nm.

In a subsequent step, a layer of a graded metal alloy 116, 216 is deposited over the diffusion barrier layer by an ALD process, preferably by PEALD. The layer contains at least two metals and preferably comprises one of the metals used in the diffusion barrier layer. In the preferred embodiment the layer comprises one of the metals used. in the diffusion barrier and copper. For example, when the diffusion barrier layer contains tungsten, the alloy layer preferably contains an alloy of tungsten and copper. When the diffusion barrier layer contains tantalum, the metal alloy layer is preferably made of tantalum and copper. The thickness of the metal alloy layer is preferably between about 10 Å and 25 Å. Inter-mixing of different metals in the diffusion barrier and the alloy layer is possible as well.

In the first embodiment, the graded composition of the metal alloy layer 116, 216 is realized by depositing several very thin and alternating sublayers of two metals. Their thickness is varied to provide a graded composition of the metals in the alloy layer 116, 216: The metal alloy layer acts as a barrier-adhesion-seed layer as such or together with an ALD barrier layer. In the latter case, the metal alloy layer is preferably deposited over the ALD barrier layer.

According to the first embodiment, the deposition of the graded alloy layer comprises two sub-steps. In the first sub-step, one or more atomic layers of metal that is present in the diffusion barrier layer is deposited with ALD, preferably PEALD. When the underlying barrier layer contains tungsten, the deposition of the graded metal alloy layer begins with depositing metallic tungsten, and accordingly, when the barrier layer contains tantalum the deposition begins with depositing metallic (elemental) tantalum.

The metallic sublayers may be deposited, for example, using hydrogen plasma according to Eq.1, below. The metal source chemical is introduced as a gaseous precursor pulse into the reaction chamber provided with the substrate. The metal source chemical adheres on to the substrate until the surface of the substrate is covered with the chemisorbed source chemical molecules and thus, a monolayer of the metal source is formed on the substrate in a self-limiting maimer. The reaction chamber is purged from excess of the gaseous chemicals and reaction by-products. Plasma is applied to excite the molecular layer of the adsorbed metal source chemical and to form no more than one atomic layer of metal over the substrate. Once plasma has been switched off, the reaction chamber is purged again to remove any gaseous byproducts of the reaction. Here, one metal deposition cycle comprises a pulse of gaseous metal source chemical, a purging pulse, plasma excitation and a second purging pulse. The purging is formed of a pulse of an inert purging gas that removes excess of gaseous reactants and reaction by-products out of the reaction chamber. Another way of providing the purging of the reaction chamber is to pump the reaction chamber to higher vacuum. A combination of inert purging gas and vacuum may also be used. The thickness of the metallic layer is controlled by the number of deposition cycles. The source of the metal may be a metal halide reactant. For example, the source of tungsten may be WF$_6$ and the source of tantalum may be, for example, TaCl$_5$.

In one embodiment of the second sub-step of the deposition of the graded metal alloy, a copper precursor, such as CuCl or CuI, or any organometallic source chemical, such as Cu(thd)$_2$ of Cu(acac)$_2$, is introduced as a gaseous pulse into the reaction chamber, the reaction chamber is purged and then hydrogen plasma is applied to provide a reaction of Eq. 2 to form no more than one atomic layer of copper over the substrate. Here, one copper deposition cycle comprises a pulse of a gaseous metal source, a purging pulse, plasma excitation and a second purging step. The thickness of the layer is controlled by the number of the deposition cycles.

In the formation of the graded metal alloy layer, the first and second sub-steps (e.g., Eq. 1 and Eq. 2) are altered and repeated. Depending on the desired thickness and composition gradient of the layer, the number and relative frequency of the repeated and alternated depositing cycles of the two metals is varied. By adjusting the thickness of the metal layers to provide a layer containing two metals an alloy layer with low resistivity can be formed, for instance an alloy layer of W/Cu or Ta/Cu.

The deposition of the graded metal alloy layer is finished with copper deposition cycles to provide a copper seed layer, having a thickness from few atomic layers to few nanometers of pure copper, preferably 5 Å–20 nm, more preferably 10 Å–10 nm. To complete the copper metallization, an ECD copper layer is deposited directly over the copper seed layer. Optionally, the ECD copper can be replaced with ALD copper simply by continuing the deposition of the seed layer.

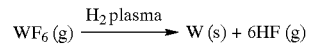  (Eq. 1)

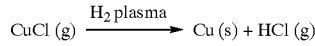  (Eq. 2)

The structure of the layer of graded metal alloy provided according to the first embodiment of the present invention is shown in FIG. 1. The deposition sequence can be as given below, where it will be understood that multiple cycles of each stage can be employed, with vary frequency of the WF$_6$ and CuCl pulses in the middle stage:

depositing a layer of W, where a gaseous WF$_6$ pulse is introduced into the reaction chamber, Ar or N$_2$ pulse is introduced for purging (or the chamber is evacuated into vacuum), hydrogen plasma is introduced over the substrate, Ar or N$_2$ pulse is introduced for purging (and/or the chamber is evacuated into vacuum);

depositing a layer of W/Cu alloy, where a gaseous WF$_6$ pulse is introduced into the reaction chamber, Ar or N$_2$ pulse is introduced for purging (or the chamber is evacuated into vacuum), hydrogen plasma is introduced over the substrate, Ar or N$_2$ pulse is introduced for purging (or the chamber is evacuated into vacuum), a gaseous CuCl pulse is introduced into the reaction chamber, Ar or N$_2$ pulse is introduced for purging (of the chamber is evacuated into vacuum), N$_2$ plasma is introduced over the substrate, Ar or N$_2$ pulse is introduced for purging (or the chamber is evacuated into vacuum); and depositing a layer of Cu, where a gaseous CuCl pulse is introduced into the reaction chamber, a pulse of Ar or $N_2$ is introduced for purging (or the chamber is evacuated into vacuum), $N_2$ plasma is introduced over the substrate, and a pulse of Ar of $N_2$ is introduced for purging (or the chamber is evacuated into vacuum).

EXAMPLE 1

An example of a process for producing a layer that acts as a barrier layer, an adhesion layer and a seed layer in an IC is provided below. The duration (s) and approximate mass flow rate (sccm)of each pulse are given in parentheses.

Step 1:
Repeat 20 deposition cycles of ALD to produce about 15 Å thick $WN_xC_y$ barrier layer. One deposition cycle contains precursor pulses and purging pulses and one cycle can be written as:

Introduce a pulse (0.2 s, 30 sccm) of gaseous $WF_6$ carried with Ar (300 sccm) into the reaction chamber provided with the substrate; introduce an Ar purging pulse (1 s, 300 sccm); introduce a pulse (0.5 s, 50 sccm) of $NH_3$ carried with Ar (300 sccm); introduce an Ar purging pulse (1s, 300 sccm); introduce a pulse of triethyl boron (TEB) by passing an Ar flow through a TEB container (1 s, 300 sccm); introduce an Ar purging pulse (1 s, 300 sccm).

Step 2:
Repeat 10 deposition cycles of PEALD to produce a layer of W about 3 Å thick. One deposition cycle can be written as:

Introduce a pulse (0.2 s, 30 sccm) of gaseous $WF_6$ carried with Ar (300 sccm) into the reaction chamber provided with a substrate; introduce an Ar purging pulse (1 s, 300 sccm); introduce $H_2$/Ar plasma over the substrate (2 s, 300 sccm); introduce an Ar purging pulse (1 s, 300 sccm).

Step 3:
Repeat 10 times a sequence of 1 cycle PEALD W+1 cycle PEALD Cu to produce a layer of W/Cu alloy about 5 Å thick. Each sequence of tungsten and copper cycles can be written as:

Introduce a pulse (0.2 s, 30 sccm) of gaseous $WF_6$ carried with Ar (300 sccm) into the reaction chamber provided with a substrate; introduce an Ar purging pulse (1 s, 300 sccm); introduce $H_2$/Ar plasma pulse over the substrate (2 .s, 300 sccm); introduce an Ar purging pulse (1 s, 300 sccm); introduce a gaseous CuCl pulse (0.5 s) with Ar (300 sccm) passing through heated (350–450° C.) CuCl container; introduce an Ar purging pulse (1 s); introduce a $H_2$/Ar plasma pulse substrate (2 s, 300 sccm); introduce an Ar purging pulse (1 s, 300 sccm).

Step 4:
Repeat 50 deposition cycles of PEALD to produce a layer of copper about 10 Å thick. One copper cycle can be written as:

Introduce a pulse of gaseous CuCl with Ar passing through heated CuCl container (0.5 s, 300 sccm) into the reaction chamber provided with a substrate; introduce an Ar purging pulse (1 s, 300 sccm); introduce a hydrogen-argon plasma pulse over the substrate (2 s; 300 sccm); introduce an Ar purging pulse (1 s, 300 sccm).

A suitable deposition temperature is between about 275° C. and 375° C. The chemical source line pressure is adjusted to between about 200 and 600 Torr and the reactor pressure is adjusted to about 0.1 to 10 Torr. The plasma power is adjusted to about 100 to 300 W.

EXAMPLE 2

A process for producing a structure according to a preferred embodiment of the present invention can be presented as following:

Step 1:
Repeat 5 times a sequence of 10 cycles PEALD TaN+10 cycles PEALD Ta to produce a barrier layer of Ta/TaN about 25 Å thick.
One cycle of PEALD TaN can be written as:
Introduce a pulse of gaseous $TaF_5$ with Ar passing through heated (150° C.) $TaF_5$ container into the reaction chamber provided with a substrate (0.5 s, 300 sccm); introduce an Ar purging pulse (1 s, 300 sccm); introduce a $H_2/N_2$/Ar plasma pulse over the substrate (2 s, 300 sccm), introduce an Ar purging pulse (1 s, 300 sccm).
One cycle of Ta can be written as:
Introduce a pulse of gaseous $TaF_5$ (0.5 s); introduce an Ar purging pulse (1 s); introduce a $H_2$/Ar plasma pulse over the substrate (2 s); introduce an Ar purging pulse (1 s).

Step 2:
Repeat 10 times a sequence of 1 cycle PEALD Cu+1 cycle PEALD Ta to produce a nanolaminate layer about 5 Å thick. The subsequent cycles of Cu and Ta can be written as:

Introduce a pulse of gaseous CuCl into the reaction chamber provided with a substrate (0.5 s); introduce an Ar purging pulse (1 s); introduce a $H_2$/Ar plasma pulse over the substrate (2 s); introduce an Ar purging pulse (1 s); introduce a pulse of gaseous $TaF_5$ (0.2 s); introduce an Ar purging pulse (1 s), introduce $H_2$/Ar plasma pulse over the substrate (2 s), introduce an Ar purging pulse (1 s).

Step 3:
Repeat 50 deposition cycles of PEALD to produce a layer of copper about 10 Å thick. One cycle of copper can be written as:

Introduce a pulse of gaseous CuCl into the reaction chamber (0.5 s); introduce an Ar purging pulse (1 s); introduce $H_2$/Ar plasma pulse over the substrate (2 s); introduce an Ar purging pulse (1 s).

A suitable deposition temperature is between about 150° C. and 400° C. The source line pressures are adjusted to between about 200 and 600 Torr with Ar carrier gas flow of 300 sccm. The reactor pressure is controlled to between about 0.1 and 10 Torr. The plasma power is adjusted to about 100 to 300 W.

A copper layer deposited by PEALD can be used instead of a copper layer deposited by ECD to achieve the required final thickness for the metallization layer.

According to the second embodiment of the invention in the formation of the metal alloy layer 116, 216, an exchange reaction is utilized. In the exchange reaction, an intermediate and relatively stable phase of metal fluoride is formed on the substrate. The fluoride ligands, of the solid fluoride attached to the substrate are then stripped away by aid of hydrogen plasma to provide no more than one atomic layer of metal over the substrate.

The alloy layer produced according to the second embodiment preferably contains tungsten and copper or tantalum and copper. An example of an overall reaction for forming copper-tungsten alloy is presented in Eq. 3.

One deposition cycle to form a layer of a metal alloy in the second embodiment consists of steps wherein a layer of metal fluoride of a first metal is formed over the substrate, a pulse of a second metal precursor is introduced to form layer that contains the metal fluoride and the second metal precursor, the fluoride and possible other ligands attached to the metal atoms on the substrate are stripped with hydrogen plasma to provide a metal alloy layer consisting of the first and second metal.

According to one preferred embodiment of the present invention a pulse of gaseous copper precursor, such as CuCl, CuI, or any suitable organometallic copper precursor, such as copper(II)acetylacetonate Cu(acac)$_2$, is introduced into the reaction chamber and followed by a pulse of WF$_6$, NbF$_5$ or TaF$_5$ or a pulse of other gaseous metal fluoride such as CF$_4$, NF$_3$, or metal fluorides of Mo, Cr, to provide an exchange reaction that takes place on the surface of the IC. The exchange reaction forms a stable solid phase of CuF$_2$, which may also contain W or Ta, or any other metal that has been used in previous pulse. Next, hydrogen plasma is applied to strip the fluoride from the CuF$_2$ layer to provide no more than one atomic layer of copper metal over the surface. At the same time, a layer of atomic tungsten or tantalum can be produced to form an alloy with copper. By controlling the number of ALD cycles and the pulse sequences, a graded alloy thin film of W/Cu can be produced. For example, the ratio of Cu and W containing pulses can be increased during the deposition so that first the alloy contains little or no copper and then the relative amount of copper gradually increases towards the top surface of the alloy and the relative amount of W gradually decreases towards the top surface of the alloy. Respectively, a graded alloy thin film of Ta/Cu can be produced when suitable precursors of tantalum and copper are applied.

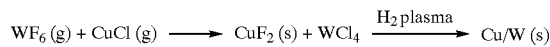

(3)

The complete deposition process for producing an adhesion/barrier/seed layer comprises two steps, which can be, for instance:

forming a diffusion barrier layer by ALD or PEALD;

forming a metal alloy layer as an adhesion layer according to Eq. 3, and by performing several deposition cycles of: introducing a gaseous pulse of WF$_6$ into the reaction chamber provided with the substrate, introducing a N$_2$ purging pulse (or evacuate the reaction chamber), introducing a gaseous pulse of CuCl, introducing a N$_2$ purging pulse (or evacuate the reaction chamber), introducing hydrogen plasma over the substrate, introducing a N$_2$ purging pulse (or evacuate the reaction chamber);

step of finishing the metal alloy layer with one or more deposition cycles to produce metallic copper according to Eq. 2.

EXAMPLE 3

First, a barrier layer is formed over the dielectric layer of an IC. 20 deposition cycles of ALD are repeated to form a WN$_x$C$_y$ layer, the thickness of which layer is about 15 Å. In one deposition cycle a WF$_6$ pulse with duration of 0.2 seconds is introduced into a reaction chamber provided with the substrate containing the IC, an Ar purging pulse with duration of 1 second is introduced, a NH$_3$ pulse with duration of 0.5 seconds is introduced, an Ar purging pulse with duration of 1 second is introduced, a triethyl boron (TEB) pulse with duration of 1 second is introduced, and an Ar purging pulse with duration of 1 second is introduced. The temperature of the reaction chamber is constant and set to a value selected from a range of about 150° C.–400° C. The pressure of the reactor is below room pressure, preferably selected from a range of about 0.1–10 mbar.

Second, a layer of metal alloy is formed over the barrier layer either in the same reaction chamber as the diffusion barrier or in another process module of a platform. PEALD deposition cycles are repeated 20 times to form about 5 Å thick W/Cu alloy layer. In one deposition cycle a WF$_6$ pulse of 0.2 seconds is introduced into the reaction chamber, an Ar purging pulse of 1 second is introduced, a CuCl pulse of 0.5 seconds, is introduced, an Ar purging pulse of 1 second is introduced, a H$_2$/Ar plasma pulse of 2 seconds is introduced, and an Ar purging pulse of 1 second is introduced. During plasma processes the pressure of the reaction chamber is preferably selected from a range of about 0.1–10 mbar.

The above-mentioned W/Cu alloy has low resistivity, about 10 $\mu\Omega$cm, and it can be used as a contact due to its good mechanical and thermal properties. A copper layer deposited by PEALD or CVD can be used instead of a copper layer deposited by ECD to achieve the required metallization.

Although the foregoing invention has been described in terms of certain preferred embodiments, other embodiments will be apparent to those of ordinary skill in the art. Moreover, although illustrated in connection with a particular process flow and structure, the skilled artisan will appreciate variations of such schemes for which the methods disclosed herein will have utility. Additionally, other combinations, omissions, substitutions and modifications will be apparent to the skilled artisan, in view of the disclosure herein. Accordingly, the present invention is not intended to be limited by the recitation of the preferred embodiments, but is instead to be defined by reference to the appended claims.

What is claimed is:

1. A method of forming a multilayer structure comprising a barrier layer, an adhesion layer and a copper seed layer for an integrated circuit comprising:

depositing a metal nitride diffusion barrier layer comprising at least one refractory metal over a dielectric layer of the integrated circuit by an atomic layer deposition type process; and depositing over the diffusion barrier layer a graded metal alloy layer comprising copper and the refractory metal of the diffusion barrier layer by plasma enhanced atomic layer deposition, wherein the deposition of the graded metal alloy layer begins with deposition of the metal of the diffusion barrier layer and is finished with deposition of metallic copper.

2. The method of claim 1, wherein the diffusion barrier layer comprises the refractory metal and its nitride.

3. The method of claim 2, wherein the diffusion barrier layer further comprises a carbide of the refractory metal.

4. The method of claim 1, wherein the diffusion barrier layer is a nanolaminate of the refractory metal and its nitride.

5. The method of claim 1, wherein the diffusion barrier layer is a sandwich structure of the refractory metal and its nitride.

6. The method of claim 1, wherein the refractory metal of the diffusion barrier layer is tantalum.

7. The method of claim 1, wherein the refractory metal of the diffusion barrier layer is tungsten.

8. The method of claim 1, wherein the diffusion barrier layer comprises tungsten, tungsten nitride and tungsten carbide.

9. The method of claim 1, wherein the graded metal alloy layer is deposited by repeating and alternating depositing cycles of copper and depositing cycles of one or more metals and no more than one atomic layer of one metal is deposited during each depositing cycle.

10. The method of claim 9, wherein one depositing cycle comprises: introducing a pulse of vapor phase metal precursor into a reaction chamber of an atomic layer deposition type reactor provided with a substrate; introducing a purging pulse, introducing hydrogen plasma over the substrate; and introducing a purging pulse.

11. A method of forming a multilayer structure comprising a barrier layer, an adhesion layer and a copper seed layer for an integrated circuit comprising:

depositing a diffusion barrier layer comprising at least one refractory metal over a dielectric layer of the integrated circuit by an atomic layer deposition type process; and depositing over the diffusion barrier layer a graded metal alloy layer comprising copper and the refractory metal of the diffusion barrier layer by plasma enhanced atomic layer deposition, wherein the deposition of the graded metal alloy layer begins with deposition of the metal of the diffusion barrier layer and is finished with deposition of metallic copper, wherein the process for producing the graded metal alloy layer comprises steps wherein a fluoride of the refractory metal comprising a fluoride ligand is pulsed over a substrate and thereafter a copper precursor is pulsed over the substrate to form a layer that contains the refractory metal and copper fluoride, and the fluoride ligand and any other ligands attached to the metal atoms on the substrate are stripped away with hydrogen plasma to provide a metal alloy layer of the refractory metal and copper.

12. The method of claim 11, wherein the fluoride of the refractory metal is tungsten hexafluoride ($WF_6$) and the precursor of copper is copper chloride (CuCl).

13. A method of forming a multilayer structure comprising a barrier layer, an adhesion layer and a copper seed layer for an integrated circuit comprising:

depositing a diffusion barrier layer comprising at least one refractory metal over a dielectric layer of the integrated circuit by an atomic layer deposition type process; and depositing over the diffusion barrier layer a graded metal alloy layer comprising copper and the refractory metal of the diffusion barrier layer by plasma enhanced atomic layer deposition, wherein the process for producing the graded metal alloy layer comprises copper deposition cycles wherein a stable solid phase of copper fluoride ($CuF_2$) is formed over the substrate and the fluoride ligand is stripped away with hydrogen plasma to provide no more than one atomic layer of copper metal over the substrate.

14. The method of claim 13, wherein the stable solid phase of copper fluoride is formed in an exchange reaction between a copper precursor that is attached to the substrate and a compound vapor phase fluoride precursor.

15. The method of claim 14, wherein the vapor phase fluoride precursor is tungsten hexa-fluoride ($WF_6$), tantalum pentafluoride (TaF5), niobium pentafluoride (NbF5), carbon tetrafluoride ($CF_4$) or nitrogen trifluoride ($NF_3$).

16. A method of forming a graded metal alloy layer over a diffusion barrier in an integrated circuit comprising:

depositing a graded metal alloy layer consisting essentially of metals by atomic layer deposition (ALD) on a substrate, wherein the deposition of the graded metal alloy layer begins with deposition of a first metal and is finished with deposition of a second metal.

17. The method of claim 16, wherein the first metal is a metal present in the diffusion barrier.

18. The method of claim 16, wherein the second metal is copper.

19. The method of claim 16, wherein the graded metal alloy layer is deposited by plasma enhanced ALD.

20. The method of claim 16, wherein depositing the graded metal alloy layer comprises contacting the substrate with a metal halide precursor.

21. The method of claim 20, wherein the metal halide is a metal fluoride.

22. The method of claim 20, wherein depositing the graded metal alloy layer additionally comprises contacting the substrate with a copper precursor.

23. A multilayer structure forming a diffusion barrier for copper and an adhesion layer and a seed layer for a metallization layer of an integrated circuit comprising:

a metal nitride diffusion barrier layer comprising a refractory metal deposited over a dielectric layer of the integrated circuit; and a graded metal alloy layer of copper and said refractory metal over the diffusion barrier layer wherein the copper concentration of the graded metal alloy layer is zero close to a bottom of the graded metal alloy layer and the graded metal alloy layer is covered with a layer of metallic copper.

24. The multi layer structure of claim 23, wherein the copper concentration of the graded metal alloy layer is zero within a distance of 3 Å from the bottom of the metal graded alloy layer.

* * * * *

UNITED STATES PATENT AND TRADEMARK OFFICE
CERTIFICATE OF CORRECTION

PATENT NO.         : 6,955,986 B2
APPLICATION NO. : 10/403846
DATED                 : October 18, 2005
INVENTOR(S)       : Li It is certified that error appears in the above-identified patent and that said Letters Patent is hereby corrected as shown below:

On page 1, Col. 2, line 3, under "Other Publications", please delete "2008." and insert --2006.-- therefore.

On page 1, Col. 2, line 10, under "Other Publications", please delete "et al," and insert --et al.,-- therefor.

On page 1, Col. 2, line 14, under "Other Publications", please delete "168" and insert --166-- therefor.

On page 1, Col. 2, line 15, under "Other Publications", please delete "et al," and insert --et al.,-- therefor.

On page 2, Col. 1, line 13, under "Other Publications", please delete "Epitxy" and insert --Epitaxy-- therefor.

On page 2, Col. 1, line 25, under "Other Publications", please delete "Malti," and insert --Maiti-- therefor.

On page 2, Col. 1, line 25, under "Other Publications", please delete "et al.;" and insert --et al.,-- therefor.

On page 2, Col. 2, lines 12-13, under "Other Publications", please delete ">-meta-1" and insert --p-meta-1-- therefor.

On page 2, Col. 2, line 21, under "Other Publications", please delete "tiN" and insert --TiN-- therefor.

On page 2, Col. 2, line 27, under "Other Publications", please delete "et al," and insert --et al.,-- therefor.

UNITED STATES PATENT AND TRADEMARK OFFICE
CERTIFICATE OF CORRECTION

PATENT NO. : 6,955,986 B2
APPLICATION NO. : 10/403846
DATED : October 18, 2005
INVENTOR(S) : Li It is certified that error appears in the above-identified patent and that said Letters Patent is hereby corrected as shown below:

On page 2, Col. 2, line 32, under "Other Publications", please delete "340." and insert --340)).-- therefor.

On page 2, Col. 2, line 39, under "Other Publications", please delete "$SiO_2$on" and insert --$SiO_2$ on-- therefor.

On page 2, Col. 2, line 44, under "Other Publications", after "1323" please insert --,--.

On page 2, Col. 2, line 45, under "Other Publications", please delete "Vehkarnaki," and insert --Vehkamaki,-- therefor.

On page 2, Col. 2, line 45, under "Other Publications", please delete "$SrTiO_3$" and insert --$SrTiO_3$ and-- therefor.

On page 2, Col. 2, line 48, under "Other Publications", please delete "et al," and insert --et al.,-- therefor.

In Col. 1, line 18, please delete "conductors," and insert --conductors-- therefor.

In Col. 5, line 21, please delete "used." and insert --used-- therefor.

In Col. 5, line 34, please delete "216:" and insert --216.-- therefor.

In Col. 5, line 55, please delete "maimer." and insert --manner-- therefor.

In Col. 7, line 41, after "(2" please delete ".s," and insert --s, -- therefor.

In Col. 7, line 45, after "pulse" please insert --over the--.

In Col. 7, line 55, please delete "(2 s;" and insert --(2 s, -- therefor.

In Col. 10, line 3, please delete "seconds," and insert --seconds-- therefor.

UNITED STATES PATENT AND TRADEMARK OFFICE
CERTIFICATE OF CORRECTION

PATENT NO. : 6,955,986 B2 Page 3 of 3
APPLICATION NO. : 10/403846
DATED : October 18, 2005
INVENTOR(S) : Li It is certified that error appears in the above-identified patent and that said Letters Patent is hereby corrected as shown below:

In Col. 12, line 4, Claim 15, please delete "hexa-fluoride" and insert --hexafluoride-- therefor.

In Col. 12, line 5, Claim 15, please delete "(TaF5)," and insert --(TaF$_5$),-- therefor.

In Col. 12, line 5, Claim 15, please delete "(NbF5)," and insert --(NbF$_5$),-- therefor.

In Col. 12, line 42, Claim 24, please delete "metal graded" and insert --graded metal-- therefor.

Signed and Sealed this

Twenty-first Day of November, 2006

JON W. DUDAS
*Director of the United States Patent and Trademark Office*